United States Patent [19]

Jensen et al.

[11] 4,451,968
[45] Jun. 5, 1984

[54] METHOD AND DEVICE FOR PROVIDING AN OHMIC CONTACT OF HIGH RESISTANCE ON A SEMICONDUCTOR AT LOW TEMPERATURES

[75] Inventors: Millard Jensen, Balch Springs; Jules D. Levine, Dallas, both of Tex.

[73] Assignee: Texas Instruments Incorporated, Dallas, Tex.

[21] Appl. No.: 299,694

[22] Filed: Sep. 8, 1981

[51] Int. Cl.³ .................. H01L 31/04; H01L 31/18
[52] U.S. Cl. .................... 29/572; 29/587; 136/250
[58] Field of Search ............... 29/576 R, 587, 572; 228/115, 123, 228, 234, 903, 179; 136/250

[56] References Cited

U.S. PATENT DOCUMENTS

| | | | |
|---|---|---|---|
| 2,977,672 | 4/1961 | Telfer | 228/179 X |
| 3,128,648 | 4/1964 | Glagett | 228/234 X |
| 3,224,072 | 12/1965 | Summers et al. | 228/234 X |
| 3,310,858 | 3/1967 | Johnston | 228/123 X |
| 3,383,757 | 5/1968 | Baker et al. | 228/123 X |
| 3,412,456 | 11/1968 | Ebisawa | 29/579 |
| 3,483,610 | 12/1969 | Campo | 228/234 X |
| 3,488,841 | 1/1970 | Stern | 228/234 X |
| 3,568,301 | 3/1971 | Shibata | 228/179 |
| 3,650,454 | 3/1972 | Coucoulas | 228/234 X |
| 3,672,047 | 6/1972 | Sakamoto et al. | 228/123 X |
| 3,767,101 | 10/1973 | Genrich | 228/234 X |
| 4,142,662 | 3/1979 | Holbrook et al. | 228/123 X |
| 4,315,128 | 2/1982 | Matcovich et al. | 228/179 X |
| 4,407,320 | 10/1983 | Levine | 136/250 |

OTHER PUBLICATIONS

Prince, "Large Area Silicon Solar Cells" 14th Annular Power Source Conference, 1960, p. 26–27.

*Primary Examiner*—Brian E. Hearn
*Assistant Examiner*—David A. Hey

[57] ABSTRACT

A method and device are disclosed which allows an ohmic electrical contact with P-type semiconductor material using metallic foil at low temperature without significant diffusion of the metal into the semiconductor. The contact exhibits opposition to physical separation and has a predetermined electrical resistance.

20 Claims, 4 Drawing Figures

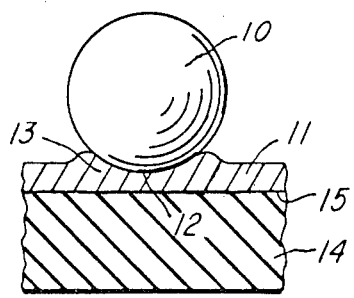
Fig. 1
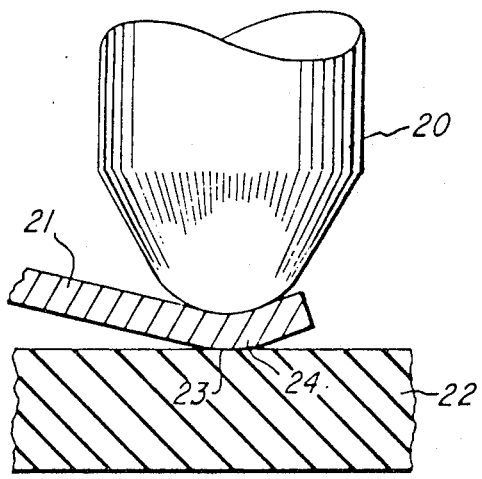
Fig. 2
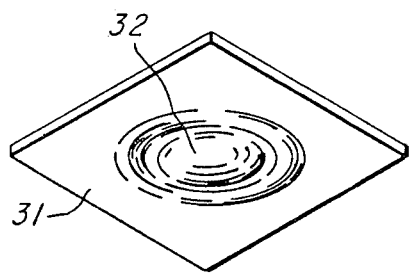
Fig. 3
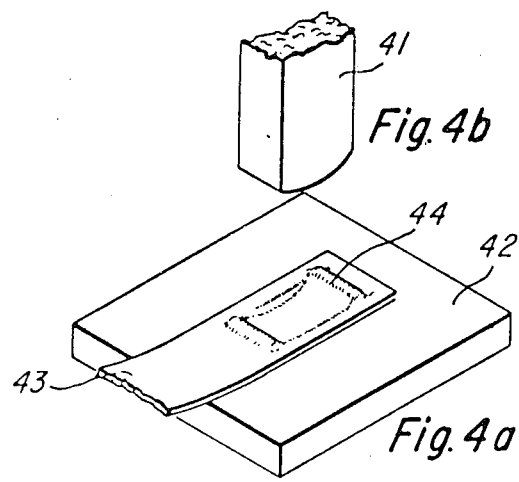
Fig. 4b
Fig. 4a

METHOD AND DEVICE FOR PROVIDING AN OHMIC CONTACT OF HIGH RESISTANCE ON A SEMICONDUCTOR AT LOW TEMPERATURES

CROSS REFERENCE

Cross reference is made to the following Document: "Large Area, Low Temperature Process, Fault Tolerant Solar Energy Converter", U.S. patent application No. 299,695, filed 9/8/81 U.S. Pat. No. 4,407,320.

BACKGROUND OF THE INVENTION

The interconnection of semiconductor devices with the use of metalization lines has been accomplished on the surface of the semiconductor as well as the interconnection of semiconductor devices to external wiring systems by the use of bond pads and other contact points. The deposition of metal on the surface of a semiconductor has been done utilizing evaporation, sputtering, as well as screen printing and the use of film pastes. For example, see the paper by M. B. Prince, entitled "Large Area Silicon Solar Cells," at the 14th Annual Power Source Conference, 1960, p. 26.

All of the above methods, however, have inherent disadvantages in that they require complex photomasking techniques, relatively high temperatures to form diffused contacts, or require relatively complex chemical processes.

A further difficulty in contacting P-doped silicon to aluminum has been encountered in that the aluminum tends to form a rectifying contact unless sufficient heat is applied to provide molecular mixing at the interface.

Accordingly, an object of the present invention is to provide a method of contacting a semiconductor to a metal in a simplified manner.

It is a further object of the present invention to provide a method of making a contact to a semiconductor utilizing aluminum without forming a rectifying contact and at process temperatures of 400° C. or less.

SUMMARY AND BRIEF DESCRIPTION OF THE INVENTION

Briefly, in accordance with the present invention a method for making ohmic contact to a semiconductor material comprises the steps of providing a first convex surface and a second surface, one of the surfaces having semiconductor characteristics, and pressing a metallic foil between the first convex surface and the second surface for a controlled duration and at a controlled pressure.

Furthermore, the semiconductor material has P-type conductivity, and the metallic foil is comprised of aluminum.

The above method results in a semiconductor device comprising a semiconductor material and a metallic foil in contact with the semiconductor material wherein the contact has an electrical resistance and a physically binding characteristic of the foil to the semiconductor material.

FIG. 1 is a partial cross-sectional view of a semiconductor sphere in electrical contact with a metallic foil in accordance with the present invention.

FIG. 2 is a cross-sectional view of a planar semiconductor material in electrical contact with an aluminum strip in accordance with the present invention.

FIG. 3 is a bottom view of the aluminum foil as in FIG. 1, wherein the semiconductor sphere is obscured behind the foil. The contact deformation of the foil is shown.

FIG. 4a is a top view of the aluminum strip contacting the planan semiconductor material as in FIG. 2.

FIG. 4b is a partial perspective view of a bonding tool used to make a contact as in FIG. 4a.

DETAILED DESCRIPTION OF THE DRAWINGS

Referring now to FIG. 1, a cross-sectional view of a semiconductor sphere 10 is shown in contact with aluminum foil 11. Support backing 14 is comprised of a layer of stainless steel having a coating such as lubricant or teflon at 15 to prevent adherence of foil 11 to the support backing 14. Electrical contact 12 is made and appreciable deformation of the aluminum foil 11 is shown at 13. This is the result of the mechanical characteristics of the convex surface of the sphere when pressed into the aluminum foil. Normally, aluminum foil will have a thin layer of oxidization on the surface; however, upon application of pressure with the convex surface of the sphere on one side and the planar surface of the support backing 14 on the opposite side of the foil, the convex surface of the sphere causes the aluminum material in contact to flow around the sphere sufficiently to remove the surface oxide layer from that portion of the foil. Thus, deformation 13 provides an oxide removal function and allows unoxidized aluminum to come in direct contact with the surface of sphere 10 at point 12. This process is performed at temperatures less than 300° C. and the deformed portion of the foil 11 at 13 prevents entry of oxygen into the contacting region. Furthermore, since the aluminum is at a relatively low temperature, migration of aluminum molecules into semiconductor sphere 10 is severely limited, however, ohmic electrical contact results since the mechanical properties of the convex surface provide sufficient molecular mixing at the interface. Additionally, a good pressure weld is developed between the aluminum foil and the semiconductor sphere resulting in significant resistance to physical separation, subsequent to release of pressure.

Aluminum foil as used in this document means a metallic sheet 6 mils or less in thickness, and having a distinctive malleable characteristic. Common household aluminum foil made from aluminum or aluminum alloys is entirely sufficient as a material.

Referring now to FIG. 2, aluminum foil 21 is shown between bonding tool 20 and semiconductor surface 22. Electrical contact is made at 23 between the two surfaces and a deformation formed at 24 results in scrubbing of the oxide layer from the surface of the aluminum foil resulting in a good pressure weld and electrical contact characteristics. Useful pressures are from 0.5 lb. to 10 lbs. per contact. Bonding tool 20 is normally coated with teflon or a liquid lubricant to prevent aluminum bonding to the tool.

Referring now to FIG. 3, a bottom view of the aluminum foil subsequent to being bonded to a semiconductor sphere is shown. Foil 31 shows the result of the pressure weld at 32 as a deformation caused by pressure of the sphere on the opposite side.

Referring now to FIG. 4a, aluminum strip 43 is shown bonded to the surface of semiconductor 42 with the bonding tool shown in FIG. 4b at 41. The oxide removing deformation shown at 44 results in a pressure weld between foil 43 and semiconductor 42 and good electrical contact.

The resistance to physical separation utilizing the present invention is strong enough to leave aluminum on the semiconductor surface when separated.

The ohmic characteristics are designed in by the use of a predetermined bulk resistive P-type semiconductor material and by control of the surface area of the pressure weld itself.

The spreading resistance or resistance of the contact region is approximated by the bulk resistivity of the semiconductor material divided by the area of the contact. More precise formulas are available, however, this equation is sufficiently accurate given variations in sphere shapes and sizes. For example, a 14 mil silicon sphere in contact with a 0.5 mil thick aluminum foil as in FIG. 1, results in a contact as shown in FIG. 3, having an approximate radius of two mils when a pressure of approximately 5.0 pounds is applied to the sphere and the aluminum foil. The temperature is maintained at approximately 250° C. for one minute or less and the bond is complete. The bulk resistivity of the semiconductor material, in this example, is one ohm per centimeter, and with the following equation the effective spreading resistance at the contact is calculated. R (spreading = R (bulk)÷4a where a=contact radius. This results in an approximate ohmic resistivity of 50 ohms for a two mil contact radius and bulk resistivity of one ohm per centimeter. This resistive value is readily reproducable for similar bulk resistive material and contact areas and is controlled by pressure, the contact time and the temperature. The ohmic characteristics may be varied or held continuous for all contacts made in this manner.

In alternative embodiments, similar calculations are used adjusting for differing areas and differing bulk resistivities. Additionally, different shapes of contacts may be used as shown, for example, in FIG. 2 and FIGS. 4a and b.

Additionally, the contacting region may be reinforced with a plastic or adhesive material having thermosetting or thermoplastic characteristics. This provides a very strong resistance to physical separation and can be positioned and thermally treated in the same step as the contact. By providing a sheet of plastic material between the semiconductor and the foil, the plastic material when fluid be substantially forced out of the contacting area by the convex surface. The assembly is then cooled while maintaining pressure.

Such an ohmic contact is useful in a variety of ways, as for example, in the cross referenced application above, Large Area, Low Temperature Process Fault Tolerant Solar Energy Converter, U.S. application No. 299,695, filed 9/8/81 now U.S. Pat. No. 4,407,320, which is hereby incorporated by reference. The ohmic contacts are used to provide series resistors to each of the photovoltaic devices, and thus provide short circuit protection to a solar array.

Although the invention has been described and illustrated with respect to specific embodiments, it is understood that changes or modifications can be made without departing from the spirit and scope of the invention described herein.

What is claimed is:

1. A method for making ohmic contact to a solar array, comprising the steps of:
providing a solar array including a plurality of substantially spherical semiconductor particles;
pressing respective ones of said particles against a metal foil while applying pressure and low heat between said particle and said foil;
whereby an ohmic contact is formed between said particle and said foil.

2. The method of claim 1, wherein said pressure is applied to achieve a predetermined degree of deformation of said foil,
whereby said ohmic contact has approximately a predetermined resistance.

3. A method for making ohmic contact between aluminum and silicon, comprising the steps of:
providing a silicon particle having an exposed convex silicon surface;
providing an aluminum foil;
pressing said silicon particle into said aluminum foil at a low temperature to deform said aluminum foil;
whereby said deformation step removes aluminum oxides from the surface of said aluminum foil to permit good contact between said silicon and said aluminum.

4. The method of claim 1, wherein said temperature is less than 300 C.

5. The method of claim 2, wherein said temperature is less than 300 C.

6. The method of claim 3, wherein said temperature is less than 300 C.

7. The method of claim 1, wherein pressure in the range of 0.5 to 10 pounds per particle is applied between said respective particle and said metal foil.

8. The method of claim 2, wherein pressure in the range of 0.5 to 10 pounds per particle is applied between said respective particle and said metal foil.

9. The method of claim 3, wherein pressure in the range of 0.5 to 10 pounds per particle is applied between said respective particle and said metal foil.

10. The method of claim 4, wherein pressure in the range of 0.5 to 10 pounds per particle is applied between said respective particle and said metal foil.

11. The method of claim 5, wherein pressure in the range of 0.5 to 10 pounds per particle is applied between said respective particle and said metal foil.

12. The method of claim 6, wherein pressure in the range of 0.5 to 10 pounds per particle is applied between said respective particle and said metal foil.

13. The method of claim 1, wherein said respective particle is pressed over a predetermined distance, to deform said metal foil to provide a contact having approximately a predetermined resistance.

14. The method of claim 12, wherein said respective particle is pressed over a predetermined distance, to deform said metal foil to provide a contact having approximately a predetermined resistance.

15. The method of claim 3, wherein said respective particle is pressed over a predetermined distance, to deform said metal foil to provide a contact having approximately a predetermined resistance.

16. The method of claim 4, wherein said respective particle is pressed over a predetermined distance, to deform said metal foil to provide a contact having approximately a predetermined resistance.

17. The method of claim 10, wherein said respective particle is pressed over a predetermined distance, to deform said metal foil to provide a contact having approximately a predetermined resistance.

18. The method of claim 6, wherein said respective particle is pressed over a predetermined distance, to deform said metal foil to provide a contact having approximately a predetermined resistance.

19. The method of claim 7, wherein said respective particle is pressed over a predetermined distance, to deform said metal foil to provide a contact having approximately a predetermined resistance.

20. The method of claim 9, wherein said respective particle is pressed over a predetermined distance, to deform said metal foil to provide a contact having approximately a predetermined resistance.

* * * * *